United States Patent
Kim et al.

(10) Patent No.: US 10,003,040 B2
(45) Date of Patent: *Jun. 19, 2018

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Dong Chan Kim, Hwaseong-si (KR); Won Jong Kim, Suwon-si (KR); Eung Do Kim, Seoul (KR); Dong Kyu Seo, Suwon-si (KR); Jong Hyuk Lee, Seoul (KR); Sang Hoon Yim, Suwon-si (KR); Chang Woong Chu, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 155 days.

This patent is subject to a terminal disclaimer.

(21) Appl. No.: 14/731,729

(22) Filed: Jun. 5, 2015

(65) Prior Publication Data
US 2016/0056404 A1 Feb. 25, 2016

(30) Foreign Application Priority Data
Aug. 21, 2014 (KR) .................. 10-2014-0109196

(51) Int. Cl.
H01L 51/50 (2006.01)
H01L 51/52 (2006.01)
(Continued)

(52) U.S. Cl.
CPC ...... H01L 51/5092 (2013.01); H01L 51/5265 (2013.01); H01L 27/3244 (2013.01);
(Continued)

(58) Field of Classification Search
None
See application file for complete search history.

(56) References Cited

U.S. PATENT DOCUMENTS 6,416,888 B1 * 7/2002 Kawamura ......... H01L 51/5088
257/101
7,868,536 B2 * 1/2011 Aurongzeb ........ H01L 51/5092
313/503
(Continued)

FOREIGN PATENT DOCUMENTS

CN 102655164 A 9/2012
JP 2009-044104 A 2/2009
(Continued)

OTHER PUBLICATIONS

Machine Translation of JP 2009-044104 (pub. 2009).*
(Continued)

*Primary Examiner* — Kevin M Bernatz
(74) *Attorney, Agent, or Firm* — Lee & Morse, P.C.

(57) ABSTRACT

An organic light emitting element, includes a first electrode and a second electrode facing each other; an emission layer between the first electrode and the second electrode; and an electron injection layer between the second electrode and the emission layer, the electron injection layer including an oxide having a relative dielectric constant of 10 or more and a metal having a work function of 4.0 eV or less.

15 Claims, 6 Drawing Sheets

(51) Int. Cl.
*H01L 51/00* (2006.01)
*H01L 27/32* (2006.01)

(52) U.S. Cl.
CPC ...... *H01L 51/0059* (2013.01); *H01L 51/0073* (2013.01); *H01L 2251/303* (2013.01)

(56) References Cited

U.S. PATENT DOCUMENTS

| | | | | |
|---|---|---|---|---|
| 8,502,205 B2* | 8/2013 | Lee | ...................... | H01L 51/5215 257/40 |
| 8,592,804 B2 | 11/2013 | Rand et al. | | |
| 2006/0049410 A1* | 3/2006 | Hosokawa | .......... | H01L 51/5088 257/79 |
| 2007/0148494 A1* | 6/2007 | Kambe | ............... | H01L 51/0067 428/690 |
| 2010/0148158 A1* | 6/2010 | Kim | ........................ | C07C 2/86 257/40 |
| 2010/0301317 A1* | 12/2010 | Nowatari | ............... | B82Y 10/00 257/40 |
| 2011/0248259 A1* | 10/2011 | Oh | ...................... | H01L 51/5088 257/43 |
| 2012/0148158 A1 | 6/2012 | DeSpain | | |
| 2012/0223633 A1* | 9/2012 | Yoshinaga | .......... | H01L 27/3211 313/504 |
| 2012/0256197 A1* | 10/2012 | Matsuhisa | ........... | H01L 51/5092 257/79 |
| 2013/0313527 A1 | 11/2013 | Kim | | |
| 2015/0263306 A1* | 9/2015 | Kim | ................... | H01L 51/5092 257/40 |
| 2016/0035979 A1* | 2/2016 | Lee | ..................... | H01L 51/5092 257/40 |
| 2016/0079316 A1* | 3/2016 | Zhou | ................... | H01L 51/5278 257/13 |

FOREIGN PATENT DOCUMENTS

| | | |
|---|---|---|
| KR | 10-2001-0089298 A | 9/2001 |
| KR | 10-2006-0035790 A | 4/2006 |
| KR | 10-2009-0092112 A | 8/2009 |
| KR | 10-2009-0110622 A | 10/2009 |
| KR | 10-2010-0129596 A | 12/2010 |
| KR | 10-2011-0137087 A | 12/2011 |
| TW | 200917893 A | 4/2009 |
| TW | 201133977 A | 10/2011 |

OTHER PUBLICATIONS

Zhu, X., Sun, J., Yu, X., Wong, M., and Kwok, H., SID Symposium Digest of Tech Pap., v37(1), pp. 1292, 2006. (Year: 2006).*
X. J. Wang, et. al. AIP Journal of Applied Physics, vol. 95, #7, 3828, Apr. 1, 2004.
Provisional double patenting rejection over claims of the above-identified application; USPTO Office action dated Jul. 10, 2017, in U.S. Appl. No. 14/735,582.
Chinese Office action dated Nov. 30, 2017 for corresponding Chinese Patent Application No. 201510508265.7.
Chinese Office action dated Nov. 30, 2017 for co-pending Chinese Patent Application No. 201510514649.X.

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0109196, filed on Aug. 21, 2014, in the Korean Intellectual Property Office, and entitled: "Organic Light Emitting Diode and Organic Light Emitting Display Device Including the Same," is incorporated by reference herein in its entirety.

BACKGROUND

1. Field

Provided are an organic light emitting element and an organic light emitting device including the same.

2. Description of the Related Art

Lightweight and flatness of, for example, a monitor and a television, may be desirable, and a cathode ray tube (CRT) may be substituted with a liquid crystal display (LCD). A liquid crystal display, which is a light receiving element, requires a separate backlight, and may have, for example, limited response speed and viewing angle.

SUMMARY

Embodiments may be realized by providing an organic light emitting element, including a first electrode and a second electrode facing each other; an emission layer between the first electrode and the second electrode; and an electron injection layer between the second electrode and the emission layer, the electron injection layer including an oxide having a relative dielectric constant of 10 or more and a metal having a work function of 4.0 eV or less.

The oxide having a relative dielectric constant of 10 or more and the metal having a work function of 4.0 eV or less may form a single layer.

The metal having a work function of 4.0 eV or less may include one or more of Yb, Li, Na, K, Rb, Cs, Ca, Sr, Ba, Ce, Sm, Eu, Gd, La, Nd, Tb, Lu, Mg, or an alloy thereof.

The oxide having a relative dielectric constant of 10 or more may include one or more of $WO_3$, $MoO_3$, $Cu_2O$, $Yb_2O_3$, $Sm_2O_3$, $Nb_2O_3$, $Gd_2O_3$, or $Eu_2O_3$.

The organic light emitting element may further include an electron transport layer between the emission layer and the electron injection layer and a hole transport layer between the emission layer and the first electrode. The hole transport layer and the electron transport layer may each include an organic material.

The electron injection layer may be formed of a plurality of layers, and each of the plurality of layers may include at least one of the oxide having a relative dielectric constant of 10 or more and the metal having a work function of 4.0 eV or less.

The electron injection layer may include a first layer including the oxide having a relative dielectric constant of 10 or more, and a second layer on the first layer and including the metal having a work function of 4.0 eV or less.

The electron injection layer may include a first layer including the metal having a work function of 4.0 eV or less, and a second layer on the first layer and including the oxide having a relative dielectric constant of 10 or more.

Embodiments may be realized by providing an organic light emitting display, including a substrate; a gate line on the substrate; a data line and a driving voltage line; a switching thin film transistor connected to the gate line and the data line; a driving thin film transistor connected to the switching thin film transistor and the driving voltage line; and an organic light emitting element connected to the driving thin film transistor. The organic light emitting element includes a first electrode and a second electrode facing each other; an emission layer between the first electrode and the second electrode; and an electron injection layer between the second electrode and the emission layer, the electron injection layer including an oxide having a relative dielectric constant of 10 or more and a metal having a work function of 4.0 eV or less.

The metal having a work function of 4.0 eV or less may include one or more of Yb, Li, Na, K, Rb, Cs, Ca, Sr, Ba, Ce, Sm, Eu, Gd, La, Nd, Tb, Lu, Mg, or an alloy thereof.

The oxide having a relative dielectric constant of 10 or more may include one or more of $WO_3$, $MoO_3$, $Cu_2O$, $Yb_2O_3$, $Sm_2O_3$, $Nb_2O_3$, $Gd_2O_3$, or $Eu_2O_3$.

The organic light emitting display may further include an electron transport layer between the emission layer and the electron injection layer and a hole transport layer between the emission layer and the first electrode. The hole transport layer and the electron transport layer may each include an organic material.

The electron injection layer may be formed of a plurality of layers, and each of the plurality of layers may include at least one of the oxide having a relative dielectric constant of 10 or more and the metal having a work function of 4.0 eV or less.

The electron injection layer may include a first layer including the oxide having a relative dielectric constant of 10 or more, and a second layer on the first layer and including the metal having a work function of 4.0 eV or less.

The electron injection layer may include a first layer including the metal having a work function of 4.0 eV or less, and a second layer on the first layer and including the oxide having a relative dielectric constant of 10 or more.

The emission layer may include a red emission layer, a green emission layer, and a blue emission layer, and may further include an auxiliary layer under the blue emission layer.

The organic light emitting element may further include a red resonance auxiliary layer disposed below the red light emission layer and a green resonance auxiliary layer disposed below the green light emission layer.

The auxiliary layer may include a compound represented by Chemical Formula 1:

Chemical Formula 1

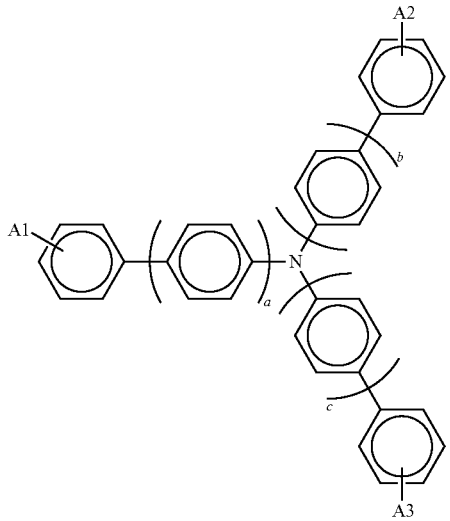

In Chemical Formula 1, A1, A2, and A3 may each be an alkyl group, an aryl group, carbazole, dibenzothiophene, dibenzofuran (DBF), and biphenyl, and a, b, and c may each be a positive number of zero to four.

The auxiliary layer may include a compound represented by Chemical Formula 2:

Chemical Formula 2

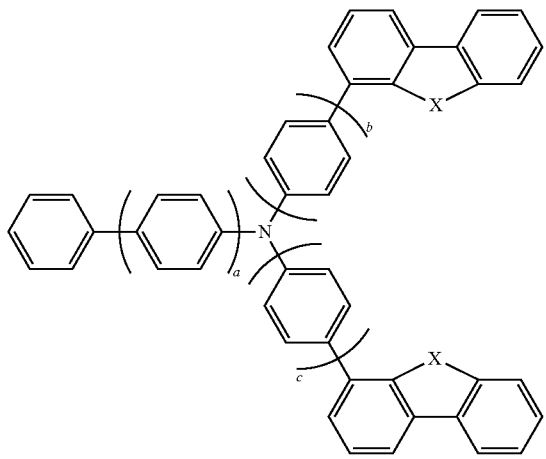

In Chemical Formula 2, a may be 0 to 3, b and c may each be 0 to 3, X may be selected from O, N, or S, and each X may be the same as or different from each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
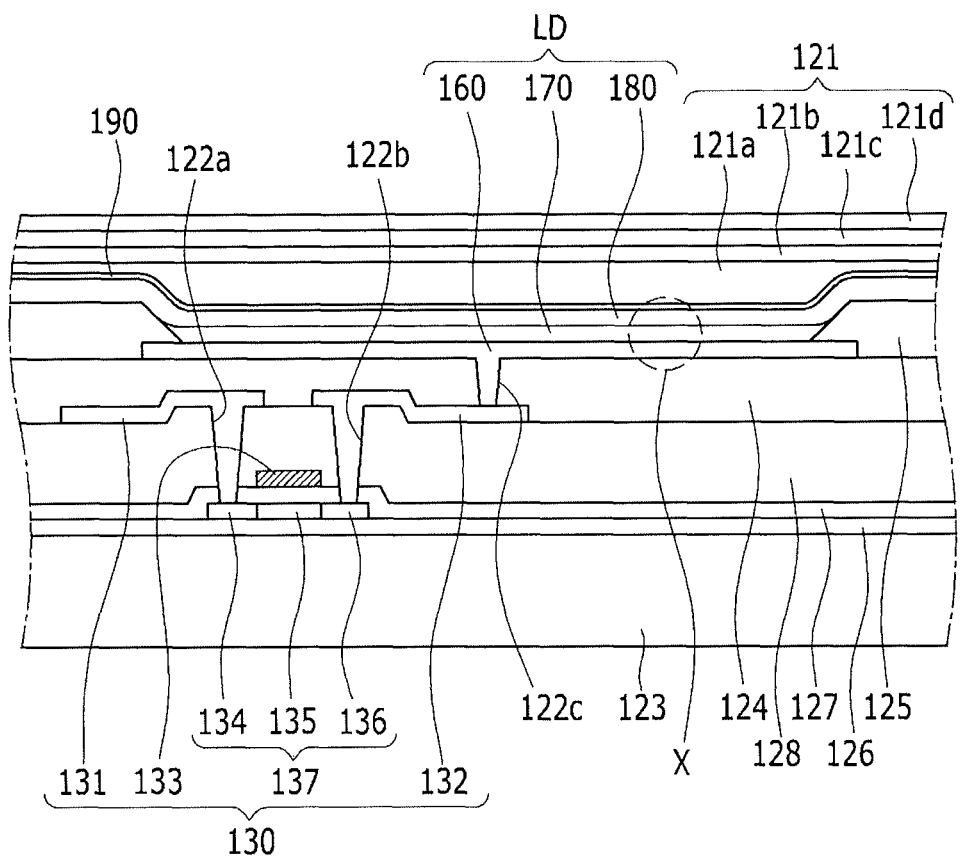
FIG. 1 illustrates a cross-sectional view of an organic light emitting display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness and dimensions of layers, films, panels, regions, etc., may be exaggerated for clarity. It will be understood that when a layer is referred to as being "on" another layer or substrate, it can be directly on the other layer or substrate, or intervening layers or substrates may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals designate like elements throughout the specification.

Figure 2:
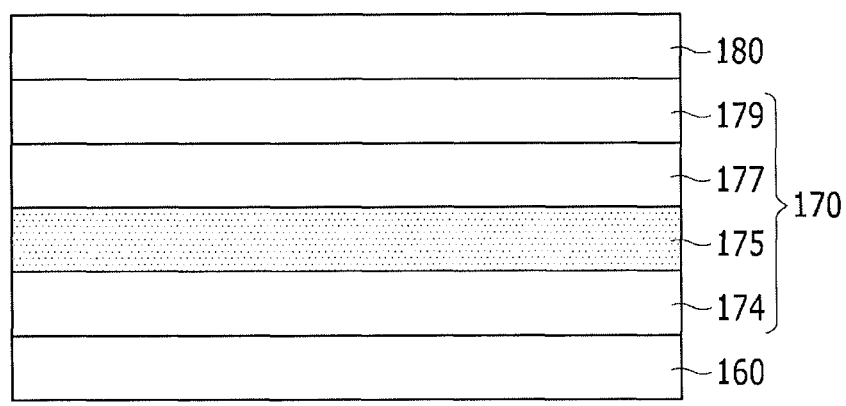
FIG. 2 illustrates an enlarged cross-sectional view of the organic light emitting display of FIG. 1.

FIG. 1 illustrates a cross-sectional view of an organic light emitting display according to an exemplary embodiment. FIG. 2 illustrates an enlarged cross-sectional view of the organic light emitting display of FIG. 1.

Referring to FIG. 1 and FIG. 2, the organic light emitting display according to the exemplary embodiment may include a substrate 123, a thin film transistor 130, a first electrode 160, a light-emitting element layer 170, and a second electrode 180. The first electrode 160 may be an anode and the second electrode 180 may be a cathode, or the first electrode 160 may be a cathode and the second electrode 180 may be an anode.

The substrate 123 may be made of, for example, an inorganic material such as glass, an organic material such as a polycarbonate, polymethylmethacrylate, polyethylene terephthalate, polyethylene naphthalate, polyamide, polyether sulfone, or a combination thereof, or of a silicon wafer.

A substrate buffer layer 126 may be disposed on the substrate 123. The substrate buffer layer 126 may prevent penetration of impurities and planarize the surface.

The substrate buffer layer 126 may be made of various materials capable of performing the functions. For example, one of a silicon nitride (SiNx) layer, a silicon oxide (SiOx) layer, and a silicon oxynitride (SiOxNy) layer may be used as the substrate buffer layer 126. In an embodiment, the substrate buffer layer 126 may be omitted according to a kind of substrate 123 and a process condition.

A driving semiconductor layer 137 may be formed on the substrate buffer layer 126. The driving semiconductor layer 137 may be formed of a material including polysilicon. The driving semiconductor layer 137 may include a channel region 135 in which impurities (dopants) are not doped, and a source region 134 and a drain region 136 in which the impurities are doped at both sides of the channel region 135. The doped ion materials may be P-type impurities such as boron (B), for example, $B_2H_6$. The impurities may vary according to a kind of thin film transistor.

A gate insulating layer 127 made of a silicon nitride (SiNx) or a silicon oxide (SiOx) may be formed on the driving semiconductor layer 137. A gate wire including a driving gate electrode 133 may be formed on the gate insulating layer 127. The driving gate electrode 133 may be formed to overlap at least a part of the driving semiconductor layer 137, for example, the channel region 135.

An interlayer insulating layer 128 covering the driving gate electrode 133 may be formed on the gate insulating layer 127. A first contact hole 122a and a second contact hole 122b exposing the source area 134 and the drain area 136 of the driving semiconductor 137 may be formed in the gate insulating layer 127 and the interlayer insulating layer 128. Like the gate insulating layer 127, the interlayer insulating layer 128 may be made of a material such as a silicon nitride (SiNx) or a silicon oxide ($SiO_x$).

A data wire including a driving source electrode 131 and a driving drain electrode 132 may be disposed on the interlayer insulating layer 128. The driving source electrode 131 and the driving drain electrode 132 may be respectively connected to the source area 134 and the drain area 136 of the driving semiconductor layer 137 through the first contact hole 122a and the second contact hole 122b, respectively, formed in the interlayer insulating layer 128 and the gate insulating layer 127.

As described, the driving thin film transistor 130 including the driving semiconductor layer 137, the driving gate electrode 133, the driving source electrode 131, and the driving drain electrode 132 may be formed. The configuration of the driving thin film transistor 130 may be variously modified.

A planarization layer 124 covering the data wire may be formed on the interlayer insulating layer 128. The planarization layer 124 may remove and planarize a step, and emission efficiency of the organic light emitting element to be formed thereon may be increased. The planarization layer 124 may have a third contact hole 122c exposing a part of the drain electrode 132.

The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In an embodiment, one of the planarization layer 124 and the interlayer insulating layer 128 may be omitted.

A first electrode of the organic light emitting element, for example, a pixel electrode 160, may be formed on the planarization layer 124. For example, the organic light emitting diode device may include a plurality of pixel electrodes 160, which may be disposed for every plurality of pixels, respectively. The plurality of pixel electrodes 160 may be spaced apart from each other. The pixel electrode 160 may be connected to the drain electrode 132 through a third contact hole 122c of the planarization layer 124.

A pixel defining layer 125 having an opening exposing the pixel electrode 160 may be formed on the planarization layer 124. For example, the pixel defining layer 125 may have a plurality of openings formed for each pixel. The light-emitting element layer 170 may be formed for each opening formed by the pixel defining layer 125, and a pixel area in which each light-emitting element layer 170 is formed by the pixel defining layer 125 may be defined.

The pixel electrode 160 may be disposed to correspond to the opening of the pixel defining layer 125. In an embodiment, the pixel electrode 160 is not disposed only in the opening of the pixel defining layer 125, and may be disposed below the pixel defining layer 125, and a part of the pixel electrode 160 may overlap with the pixel defining layer 125.

The pixel defining layer 125 may be made of, for example, resin such as a polyacrylate resin and a polyimide, or a silica-based inorganic material.

A light-emitting element layer 170 may be formed on the pixel electrode 160. A structure of the light-emitting element layer 170 will be described in detail hereinafter.

A second electrode, for example, a common electrode 180, may be formed on the light-emitting element layer 170. As described, an organic light emitting element LD including the pixel electrode 160, the light-emitting element layer 170, and the common electrode 180 may be formed.

The pixel electrode 160 and the common electrode 180 may be made of a transparent conductive material or a transflective or reflective conductive material. According to a kind of materials forming the pixel electrode 160 and the common electrode 180, the organic light emitting diode device may be a top emission type, a bottom emission type, or a double-sided emission type.

An overcoat 190 covering and protecting the common electrode 180 may be formed as an organic layer on the common electrode 180.

A thin film encapsulation layer 121 may be formed on the overcoat 190. The thin film encapsulation layer 141 may encapsulate and protect the organic light emitting element LD and a driving circuit part formed on the substrate 123 from the external environment.

The thin film encapsulation layer 121 may include organic encapsulation layers 121a and 121c, and inorganic encapsulation layers 121b and 121d which are alternately laminated. In FIG. 1, for example, two organic encapsulation layers 121a and 121c and two inorganic encapsulation layers 121b and 121d are alternately laminated to configure the thin film encapsulation layer 121.

Hereinafter, an organic light emitting element according to the exemplary embodiment of will be described with reference to FIG. 2.

Referring to FIG. 2, the organic light emitting element (part X in FIG. 1) according to the exemplary embodiment may include a structure in which the first electrode 160, a hole transport layer 174, an emission layer 175, an electron transport layer 177, an electron injection layer 179, and the second electrode 180 are sequentially layered.

The first electrode 160 may be an anode, and a material selected from materials having a high work function may be selected for easier hole injection. The first electrode 160 may be a transparent electrode or an opaque electrode. The first electrode 160 may be a transparent electrode, and may be made of indium-tin oxide (ITO), indium-zinc oxide (IZO), tin oxide (SnO2), zinc oxide (ZnO), or a conductive oxide or combinations thereof, or a metal such as aluminum, silver, and magnesium, with a small thickness. The first electrode 160 may be an opaque electrode, and may be made of metal such as aluminum, silver, and magnesium.

The first electrode 160 may be formed in a two or more-layer structure including different kinds of materials. For example, the first electrode 160 may be formed to have a structure in which indium-tin oxide (ITO)/silver (Ag)/indium-tin oxide (ITO) are sequentially stacked.

The first electrode 160 may be formed by sputtering or vacuum deposition.

The hole transport layer 174 may be disposed on the first electrode 160. The hole transport layer 174 may serve to smoothly transport holes transmitted from the first electrode 160. The hole transport layer 174 may include an organic material. For example, the hole transport layer 174 may include NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4''-tris(N-3-methylphenyl-N-phenyl-amino)-triphenylamine).

The thickness of the hole transport layer 174 may be 15 nm to 25 nm. Preferably, the thickness of the hole transport layer 174 may be 20 nm. In the present exemplary embodiment, a hole injection material may be included in the hole transport layer 174 as a modification of the hole transport layer 174, and the hole transport/injection layers may be formed as a single layer.

The emission layer 175 is disposed on the hole transport layer 174. The emission layer 175 may include an emission material that represents a specific color. For example, the emission layer 175 may display a basic color such as blue, green, or red, or a combination thereof.

The thickness of the emission layer 175 may be 10 nm to 50 nm. The emission layer 175 may include a host and a dopant. The emission layer 175 may include a material that emits red light, green light, blue light, and white light, and may be formed using a phosphorescent or fluorescent material.

The emission layer 175 may emit red light, and may, for example, include a host material, for example, CBP (carbazole biphenyl) or mCP (1,3-bis(carbazol-9-yl), and may be formed of a phosphorescent material including at least one of PIQIr(acac) (bis(1-phenylisoquinoline)acetylacetonate iridium), PQIr(acac) (bis(1-phenylquinoline)acetylacetonate iridium), PQIr(tris(1-phenylquinoline)iridium), and PtOEP (octaethylporphyrin platinum), or a fluorescent material, for example, PBD:Eu(DBM)3(Phen) or perylene.

The emission layer 175 may emit green light, may, for example, include a host material, for example, CBP or mCP, may be made of a phosphorescent material including a dopant material, for example, Ir(ppy)3(fac-tris(2-phenylpyridine)iridium) or a fluorescent material, for example, Alq3(tris(8-hydroxyquinolino)aluminum).

The emission layer 175 may emit blue light, and may, for example, include a host material, for example, CBP or mCP, and may be made of a phosphorescent material including a dopant, for example, (4,6-F2ppy)2Irpic. In an embodiment, the emission layer 175 may be made of a fluorescent material including at least one of spiro-DPVBi, spiro-6P, distyrylbenzene (DSB), distyrylarylene (DSA), a PFO-based polymer, and a PPV-based polymer.

The electron transport layer 177 may be disposed on the emission layer 175. The electron transport layer 177 may transfer electrons from the second electrode 180 to the emission layer 175. The electron transport layer 177 may prevent holes injected from the first electrode 160 from moving to the second electrode 180 through the emission layer 175. For example, the electron transport layer 177 may function as a hole blocking layer, and help holes and electrons bond in the emission layer 175.

The electron transport layer 177 may include an organic material. For example, the electron transport layer 177 may be made of any one or more of, for example, Alq3 (tris(8-hydroxyquinolino)-aluminum), PBD, TAZ, spiro-PBD, BAlq, and SAlq.

The electron injection layer 179 may be disposed on the electron transport layer 177. The electron injection layer 179 may enhance electron injection to the electron transport layer 177 from the second electrode 180. In the present exemplary embodiment, the electron injection layer 179 may include a first material, which is an oxide having a relative dielectric constant of 10 or more, and a second material, which is a metal having a work function of 4.0 eV or less. In the present exemplary embodiment, a single layer may be formed through co-deposition of the first material and the second material.

In the present exemplary embodiment, the first material may include one or more of $WO_3$, $MoO_3$, $Cu_2O$, $Yb_2O_3$, $Sm_2O_3$, $Nb_2O_3$, $Gd_2O_3$, or $Eu_2O_3$.

In the present exemplary embodiment, the second material may include one of more of an alkali metal, an alkali earth metal, a rare-earth metal, or a transition metal. The second material may include one or more of Yb, Li, Na, K, Rb, Cs, Ca, Sr, Ba, Ce, Sm, Eu, Gd, La, Nd, Tb, Lu, Mg, or an alloy thereof.

In the organic light emitting element LD according to the present exemplary embodiment, the high-dielectric oxide having a relative dielectric constant of 10 or more may help formation of an interface dipole that may reduce an electron injection barrier between the second electrode 180 and the electron transport layer 177. Electrons cannot be injected from the second electrode 180 with a single layer formed of the high-dielectric oxide. In the organic light emitting element LD of the present exemplary embodiment, the interface dipole may be formed by a combination of the first material formed of the high-dielectric oxide and a low-work function metal having a work function of 4.0 eV or less, and the electron injection barrier may be further reduced. The electron injection layer 179 according to the exemplary embodiment may be formed by co-depositing Yb and $WO_3$, efficiency of the blue element may be improved, and life span may be improved compared to the electron injection layer being formed of Yb or $WO_3$.

Figure 6:
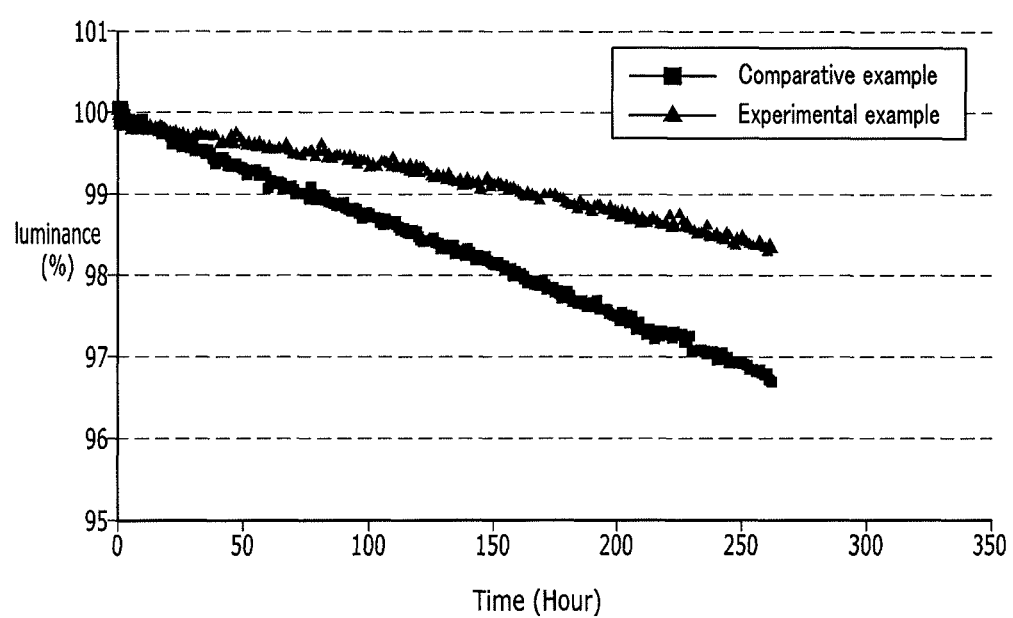
FIG. 6 illustrates a graph of the life span of the electron injection layer according to an Experimental Example.

FIG. 6 illustrates a graph of the life span of the electron injection layer according to an Experimental Example. Referring to FIG. 6, life span may be significantly improved in the Experimental Example, in which the electron injection layer is formed by co-depositing Yb and $WO_3$ compared to the Comparative example in which the electron injection layer is formed of only Yb. In FIG. 6, a negative electrode is formed of AgMg (where an amount of Ag is greater than Mg) in both of the Comparative example and the Experimental Example.

The second electrode 180 is disposed on the electron injection layer 179. The second electrode 180 may be a cathode, and a material having a low work function may be included for easier electron injection. The material may be, for example, a metal such as, for example, magnesium, calcium, sodium, potassium, titanium, indium, yttrium, lithium, gadolinium, aluminum, silver, tin, lead, cesium, and barium, or an alloy thereof, or a multi-layered structure material such as LiF/Al, LiO2/Al, LiF/Ca, LiF/Al, and BaF2/Ca.

The second electrode 180 may be formed of the above-stated alloy, a ratio of the metals may be controlled based on a temperature of deposition sources, an atmosphere, and a degree of vacuum, and an appropriate ratio may be selected.

The second electrode 180 may be formed or two or more layers.

Figure 3:
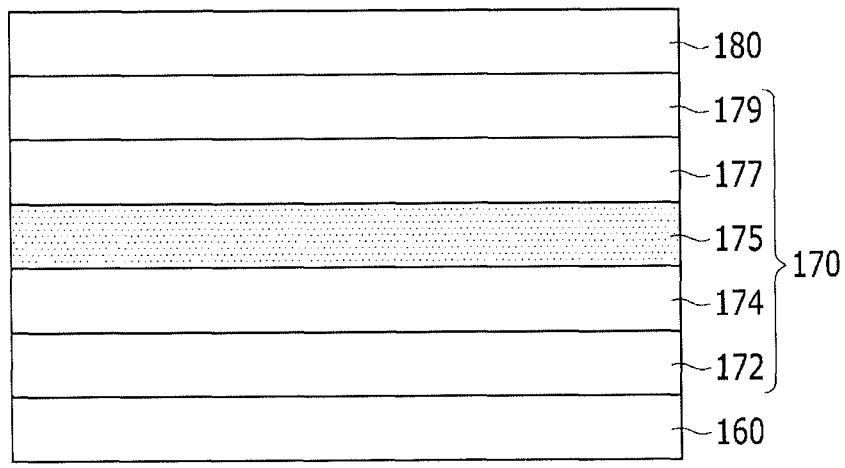
FIG. 3 illustrates a cross-sectional view of a partially modified exemplary embodiment of the organic light emitting element of FIG. 2.

FIG. 3 illustrates a cross-sectional view of a partially modified embodiment of the organic light emitting element of FIG. 2.

Referring to FIG. 3, a structure with a hole injection layer 172 added in the organic light emitting diode LD according to the exemplary embodiment of FIG. 2 is illustrated. In the present exemplary embodiment, the hole injection layer 172 may be disposed between the hole transport layer 174 and the first electrode 160. The hole injection layer 172 may be disposed for easier injection of holes from the first electrode 160 to the hole transport layer 174. In the present exemplary embodiment, the hole injection layer 172 may include a dipole material where a metal or non-metal having a work function of 4.3 eV or more and a halogen are combined. In an embodiment, the hole injection layer 172 may be formed of another inorganic or organic material.

The metal or non-metal having a work function of 4.3 eV or more may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

Except for the above-described difference, the contents described with reference to FIG. 2 may be applied to the exemplary embodiment of FIG. 3.

Figure 4:
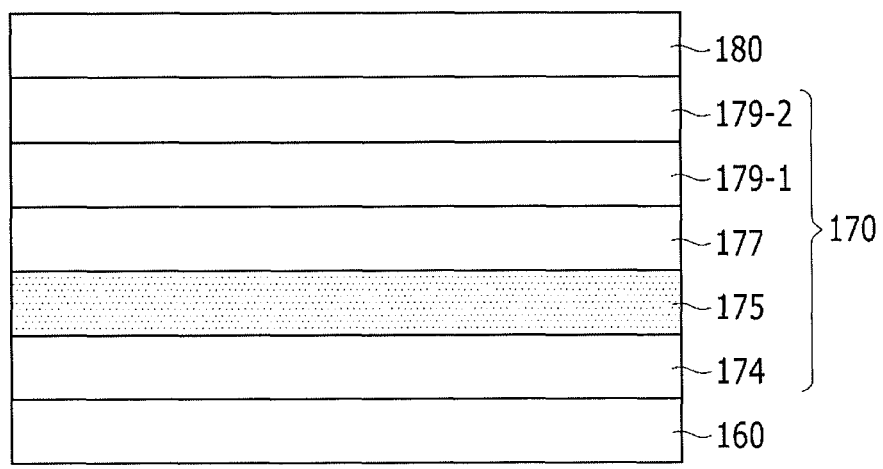
FIG. 4 illustrates a cross-sectional view of a partially modified exemplary embodiment of the organic light emitting element of FIG. 2.

FIG. 4 illustrates a cross-sectional view of a partially modified exemplary embodiment of the organic light emitting element of FIG. 2.

Referring to FIG. 4, the electron injection layer 179 of the exemplary embodiment of FIG. 2 may be double-layered in the organic light emitting element LD. In the present exemplary embodiment, the electron injection layer 179 may include a first electron injection layer 179-1 and a second electron injection layer 179-2 that are sequentially layered. The first electron injection layer 179-1 may include an oxide having a relative dielectric constant of 10 or more, and the second electron injection layer 179-2 may include a metal having a work function of 4.0 eV or less. In an embodiment, the first electron injection layer 179-1 may include a metal having a work function of 4.0 eV or less, and the second electron injection layer 179-2 may include an oxide having a relative dielectric constant of 10 or more. The electron injection layer 179 of the organic light emitting element LE according to the exemplary embodiment may be formed by sequentially layering Yb and $WO_3$, and luminance of the blue element may be high and life span may be improved compared to the electron injection layer being formed only of Yb or $WO_3$.

Table 1 shows efficiency of red, green, and blue pixels and white efficiency when the electron injection layer is formed by sequentially layering Yb and $WO_3$ according to an Example. In Comparative Example 1 the electron injection layer was formed of Yb, and in Comparative Example the electron injection layer was formed of a single material of $WO_3$. A negative electrode was formed of AgMg.

TABLE 1

|  | R efficiency | G efficiency | B efficiency | W efficiency |
|---|---|---|---|---|
| Comparative Example 1 | 42.8 | 52.4 | 5.6 | 30.2 |
| Comparative Example 2 | 36.4 | 50.1 | 5.4 | 27.6 |
| Example | 50.4 | 55.3 | 5.9 | 32.1 |

Referring to Table 1, efficiency was relatively improved when forming the electron injection layer by sequentially layering Yb and $WO_3$ compared to Comparative Example 1 and Comparative Example 2.

Except for the above-described difference, the contents described with reference to FIG. 2 may be applied to the exemplary embodiment of FIG. 4.

Figure 5:
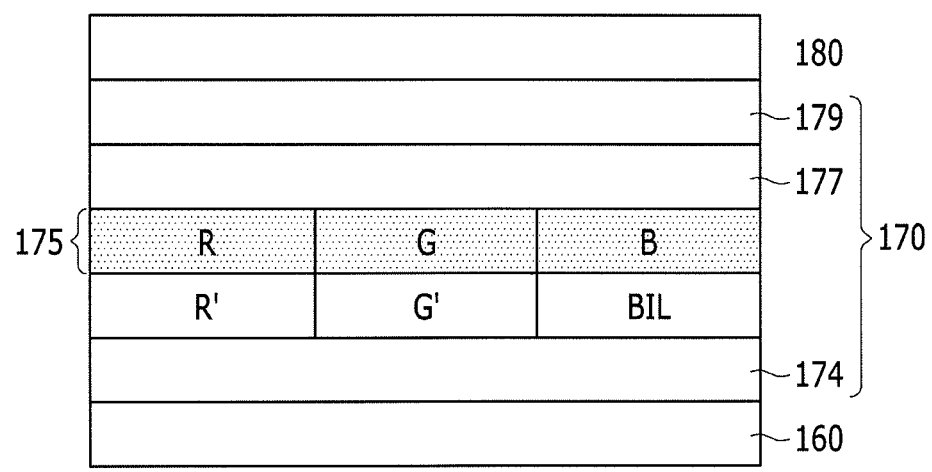
FIG. 5 illustrates a cross-sectional view of a partially modified exemplary embodiment of the organic light emitting element of FIG. 2.

FIG. 5 illustrates a cross-sectional view of a partially modified embodiment of the organic light emitting element of FIG. 2.

Referring to FIG. 5, the emission layer 175 in the organic light emitting element LD of FIG. 2 is modified. For example, in the present exemplary embodiment, the emission layer 175 may include a red emission layer R, a green emission layer G, and a blue emission layer B, and an auxiliary layer BIL may be disposed for improving efficiency of the blue emission layer B under the blue emission layer B.

The red emission layer R may be approximately 30 nm to 50 nm thick, the green emission layer G may be approximately 10 nm to 30 nm thick, and the blue emission layer B may be approximately 10 nm to 30 nm thick. The auxiliary layer BIL located at the lower end of the blue emission layer B may be approximately less than 20 nm thick. The auxiliary layer BIL may control a hole charge balance, and improve efficiency of the blue emission layer B. The auxiliary layer BIL may include a compound represented by Chemical Formula 1.

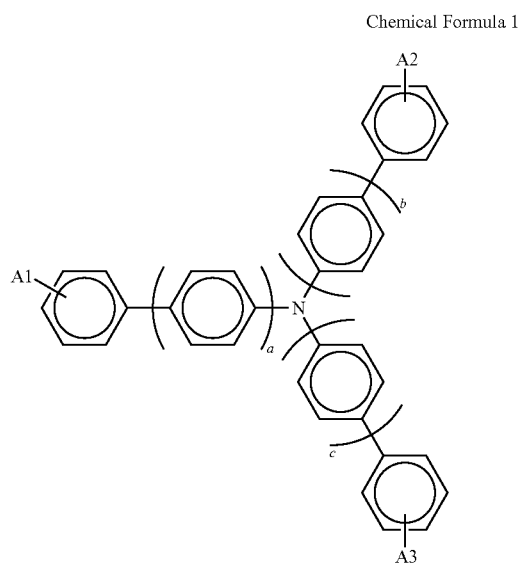

Chemical Formula 1

In Chemical Formula 1, each of A1, A2, and A3 may be an alkyl group, an aryl group, carbazole, dibenzothiophene, dibenzofuran (DBF), and biphenyl, and a, b, and c may each be a positive number of zero to four.

As an example of the compounds represented by Chemical Formula 1, the following Chemical Formulas 1-1, 1-2, 1-3, 1-4, 1-5, and 1-6 may be included.

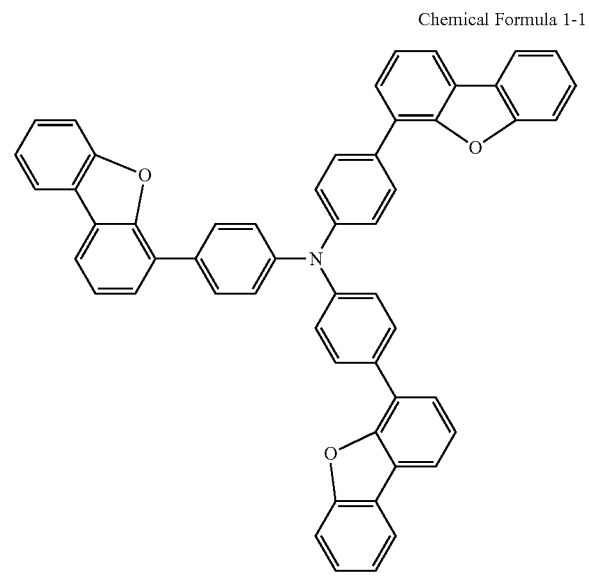

Chemical Formula 1-1

Chemical Formula 1-2
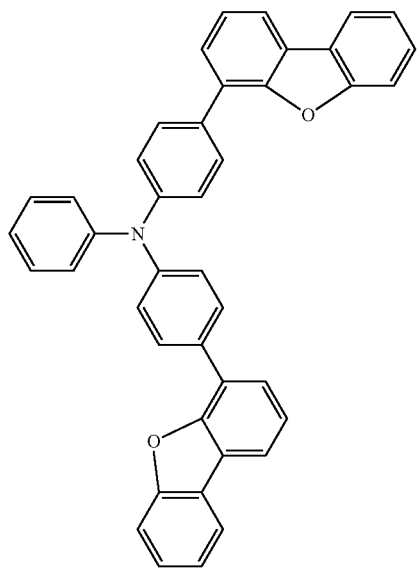
Chemical Formula 1-3
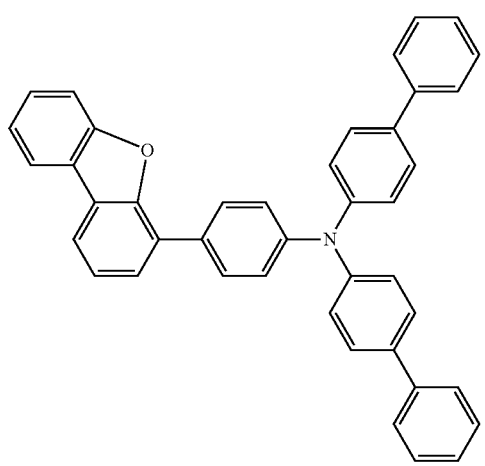
Chemical Formula 1-4
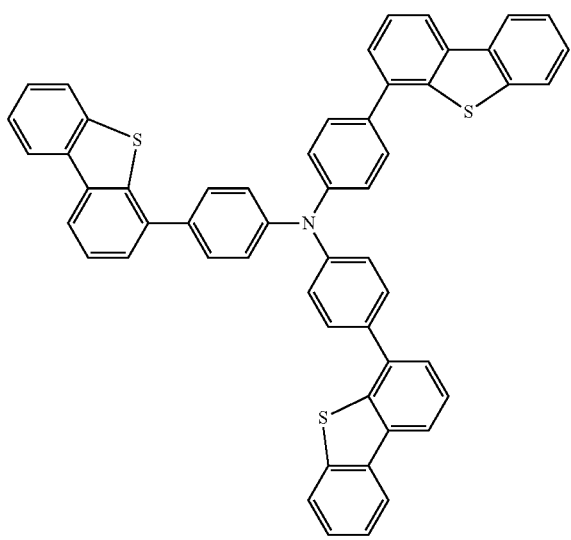
Chemical Formula 1-5
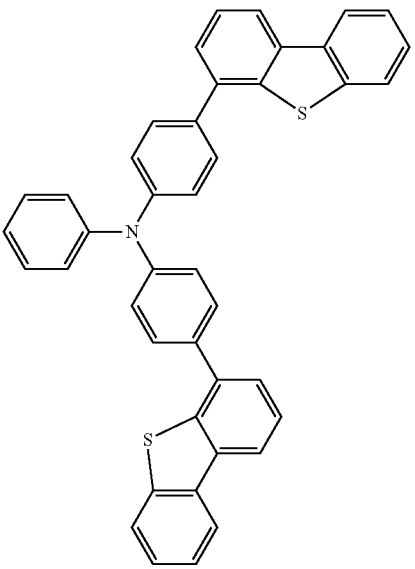
Chemical Formula 1-6
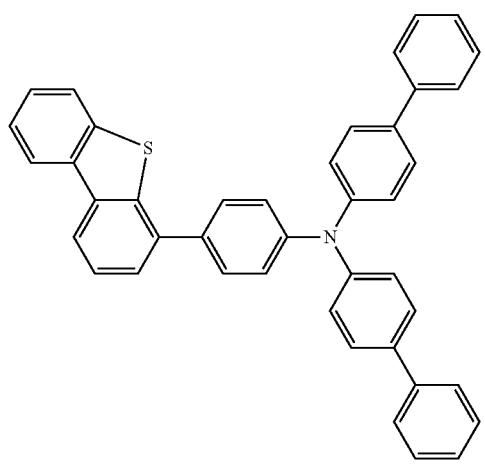
In another exemplary embodiment, the auxiliary layer BIL may include a compound represented by Chemical Formula 2.
Chemical Formula 2
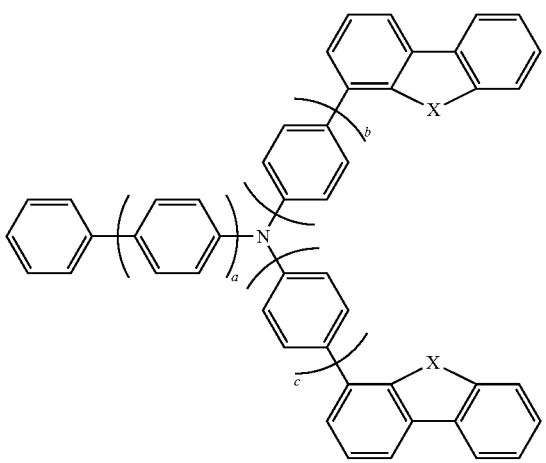

In Chemical Formula 2, a may be 0 to 3, b and c may each be 0 to 3, X may be selected from O, N, or S, and each X may be the same as or different from each other.
As an example of the compound representing Chemical Formula 2, Chemical Formulas 2-1, 2-2, 2-3, 2-4, 2-5, and 2-6 may be included.
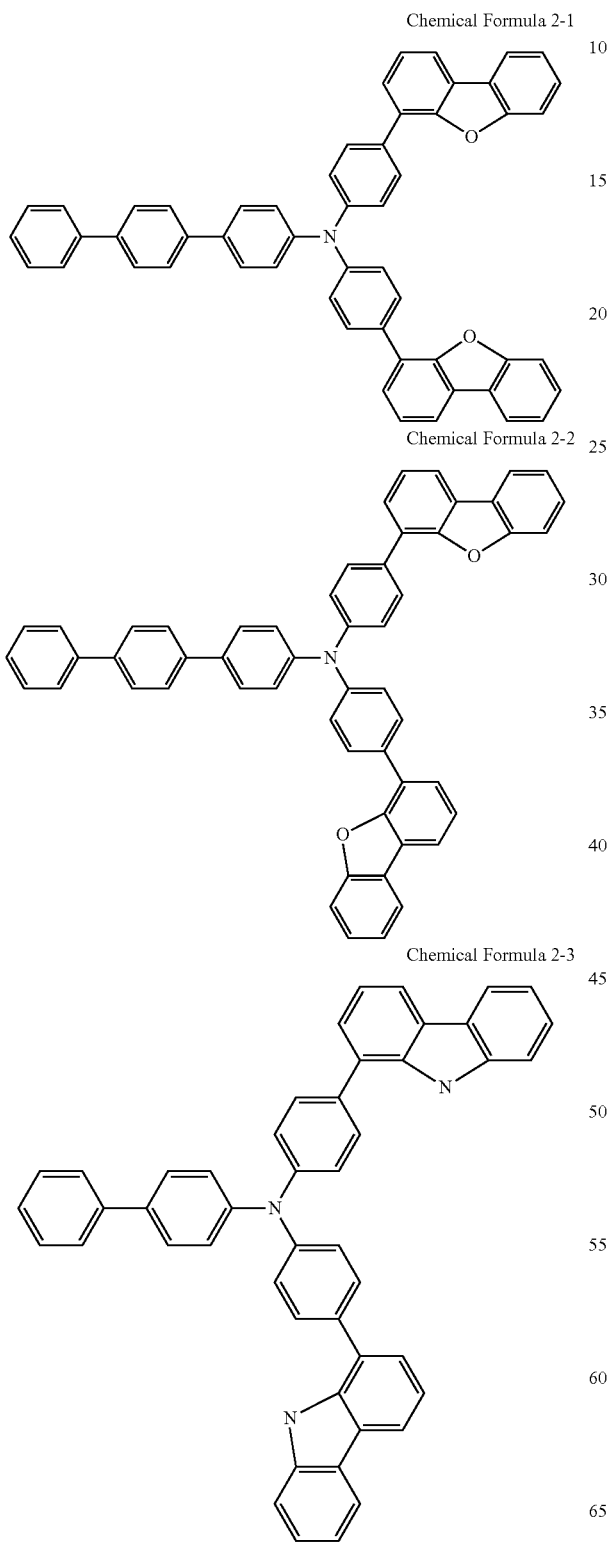
Chemical Formula 2-1
Chemical Formula 2-2
Chemical Formula 2-3
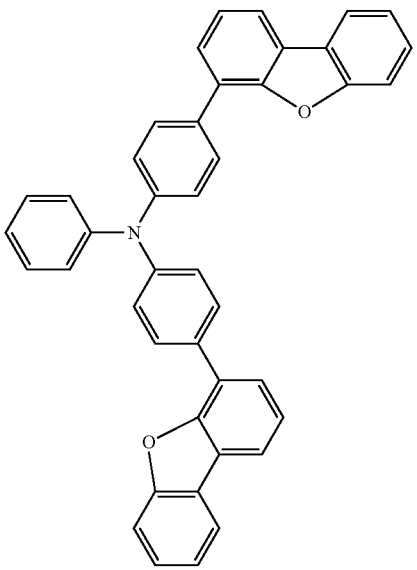
Chemical Formula 2-4
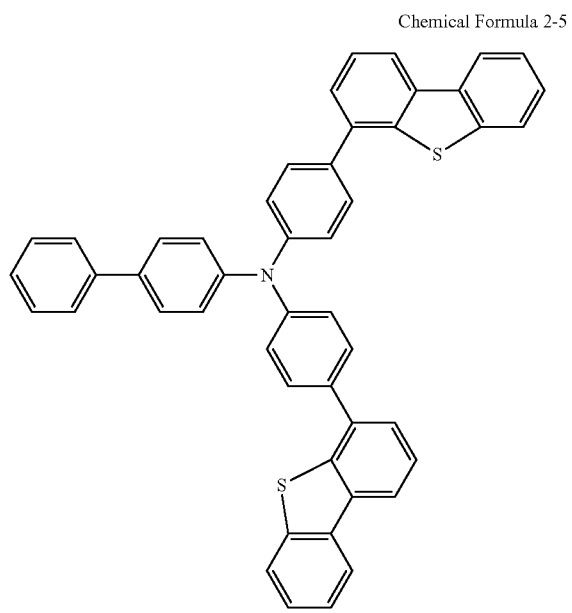
Chemical Formula 2-5

Chemical Formula 2-6

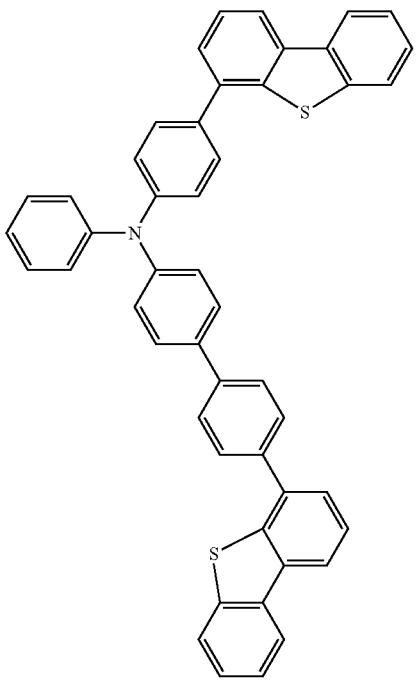

In another exemplary embodiment, the auxiliary BIL may include a compound represented by Chemical Formula 3.

Chemical Formula 3

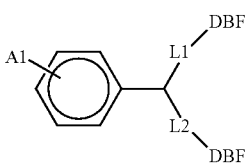

In Chemical Formula 3, A1 may be an alkyl group, an aryl group, carbazole, dibenzothiophene, or dibenzofuran (DBF), L1 and L2 may be

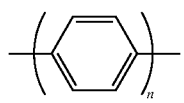

(where n is 0 to 3), and DBF connected to L1 and L2 may be replaced by carbazole or dibenzothiophene.

Hereinafter, a composition method of the auxiliary layer BIL according to an exemplary embodiment will be described. For example, the composition method of the following Chemical formula 1-1 is described.

Chemical Formula 1-1

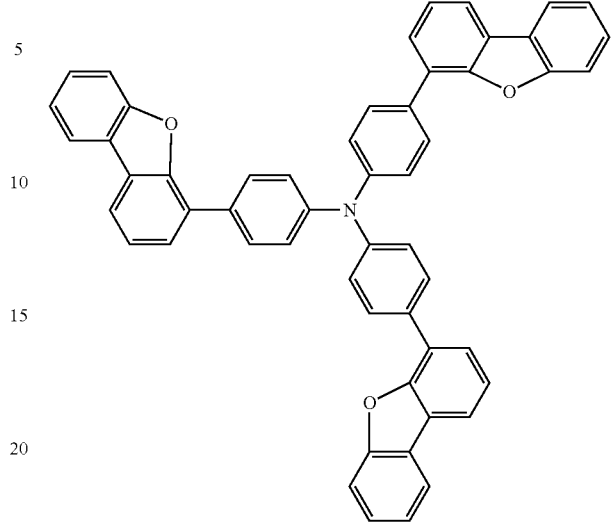

<Composition Example>

Under an argon atmosphere, 4-dibenzofuran boronic acid at 6.3 g, 4,4',4"-tribromotriphenylamine at 4.8 g, tetrakis (triphenylphosphine)palladium $(Pd(PPh_3)_4)$ at 104 mg, a sodium carbonate $(Na_2CO_3)$ solution at 48 ml (2 M), and toluene at 48 ml were put in a 300 ml 3-neck flask, and reacted at 80° C. for eight hours. The reaction solution was extracted with toluene/water, and dried with anhydrous sodium sulfate. The resultant was condensed under low pressure, and 3.9 g of a yellowish-white powder was obtained through column purification of the obtained crude product.

Referring to FIG. 5, a red resonance auxiliary layer R' may be disposed below the red light emission layer R, and a green resonance auxiliary layer G' may be disposed below the green light emission layer G. The red resonance auxiliary layer R' and the green resonance auxiliary layer G' are layers that set a resonant distance (a resonance distance) for a respective one of the colors (e.g., red or green). In some embodiments, a blue resonance auxiliary layer is not included. For example, a separate resonance auxiliary layer disposed between the hole transport layer 174 and the blue light emission layer B and the auxiliary layer BIL may not be formed below the blue light emission layer B and the auxiliary layer BIL corresponding to the red light emission layer R or the green light emission layer G. In some embodiments, the auxiliary layer BIL physically contacts the hole transport layer 174.

Although it is not illustrated in FIG. 5, the hole injection layer 172 may be formed between the first electrode 160 and the hole transport layer 174 as in the exemplary embodiment of FIG. 3.

Except for the above-described difference, the contents described with reference to FIG. 2 may be applied to the exemplary embodiment of FIG. 5.

By way of summation and review, an organic light emitting device, which is a self-emitting display element, may have a wide viewing angle, excellent contrast, and a fast response time. The organic light emitting device may include an organic light emitting element for light emission, electrons injected from one electrode and holes injected from another electrode in an emission layer may be combined, excitons may be formed, the excitons may emit energy, and light may be emitted.

Provided are an organic light emitting element that may have high efficiency and a long life span, and a light emitting display including the same. According to the exemplary embodiments, an electron injection layer may be formed by combining a metal material having a low work function and a high-dielectric oxide, and light emission efficiency may be improved. According to the exemplary embodiment, an auxiliary layer may be formed under a blue emission layer, and light emission efficiency of the blue emission layer may be improved Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting element, comprising:
a first electrode and a second electrode facing each other;
an emission layer between the first electrode and the second electrode; and
an electron injection layer between the second electrode and the emission layer,
the electron injection layer including an oxide having a relative dielectric constant of 10 or more and a metal having a work function of 4.0 eV or less,
wherein the metal having a work function of 4.0 eV or less includes Ce, Sm, Eu, Gd, La, Nd, Tb, Lu, or an alloy thereof, and
wherein the oxide having a relative dielectric constant of 10 or more includes one or more of $Yb_2O_3$, $Sm_2O_3$, $Nb_2O_3$, $Gd_2O_3$, or $Eu_2O_3$.

2. The organic light emitting element as claimed in claim 1, wherein the oxide having a relative dielectric constant of 10 or more and the metal having a work function of 4.0 eV or less form a single layer.

3. The organic light emitting element as claimed in claim 1, further comprising an electron transport layer between the emission layer and the electron injection layer and a hole transport layer between the emission layer and the first electrode,
wherein the hole transport layer and the electron transport layer each includes an organic material.

4. The organic light emitting element as claimed in claim 1, wherein the electron injection layer is formed of a plurality of layers, and each of the plurality of layers includes at least one of the oxide having a relative dielectric constant of 10 or more and the metal having a work function of 4.0 eV or less.

5. The organic light emitting element as claimed in claim 4, wherein the electron injection layer includes:
a first layer including the oxide having a relative dielectric constant of 10 or more, and
a second layer on the first layer and including the metal having a work function of 4.0 eV or less.

6. The organic light emitting element as claimed in claim 4, wherein the electron injection layer includes:
a first layer including the metal having a work function of 4.0 eV or less, and
a second layer on the first layer and including the oxide having a relative dielectric constant of 10 or more.

7. An organic light emitting display, comprising:
a substrate;
a gate line on the substrate;
a data line and a driving voltage line;
a switching thin film transistor connected to the gate line and the data line;
a driving thin film transistor connected to the switching thin film transistor and the driving voltage line; and
an organic light emitting element connected to the driving thin film transistor, wherein the organic light emitting element includes:
a first electrode and a second electrode facing each other;
an emission layer between the first electrode and the second electrode; and
an electron injection layer between the second electrode and the emission layer,
the electron injection layer including an oxide having a relative dielectric constant of 10 or more and a metal having a work function of 4.0 eV or less,
wherein the metal having a work function of 4.0 eV or less includes Ce, Sm, Eu, Gd, La, Nd, Tb, Lu, or an alloy thereof, and
wherein the oxide having a relative dielectric constant of 10 or more includes one or more of $Yb_2O_3$, $Sm_2O_3$, $Nb_2O_3$, $Gd_2O_3$ or $Eu_2O_3$.

8. The organic light emitting display as claimed in claim 7, further comprising an electron transport layer between the emission layer and the electron injection layer and a hole transport layer between the emission layer and the first electrode,
wherein the hole transport layer and the electron transport layer each includes an organic material.

9. The organic light emitting display as claimed in claim 8, wherein the electron injection layer is formed of a plurality of layers, and each of the plurality of layers includes at least one of the oxide having a relative dielectric constant of 10 or more and the metal having a work function of 4.0 eV or less.

10. The organic light emitting display as claimed in claim 9, wherein the electron injection layer includes:
a first layer including the oxide having a relative dielectric constant of 10 or more, and
a second layer on the first layer and including the metal having a work function of 4.0 eV or less.

11. The organic light emitting display as claimed in claim 9, wherein the electron injection layer includes:
a first layer including the metal having a work function of 4.0 eV or less, and
a second layer on the first layer and including the oxide having a relative dielectric constant of 10 or more.

12. The organic light emitting display as claimed in claim 7, wherein the emission layer includes a red emission layer, a green emission layer, and a blue emission layer, and further includes an auxiliary layer under the blue emission layer.

13. The organic light emitting display as claimed in claim 12, further comprising a red resonance auxiliary layer disposed below the red light emission layer and a green resonance auxiliary layer disposed below the green light emission layer.

14. The organic light emitting display as claimed in claim 12, wherein the auxiliary layer includes a compound represented by Chemical Formula 1:

Chemical Formula 1

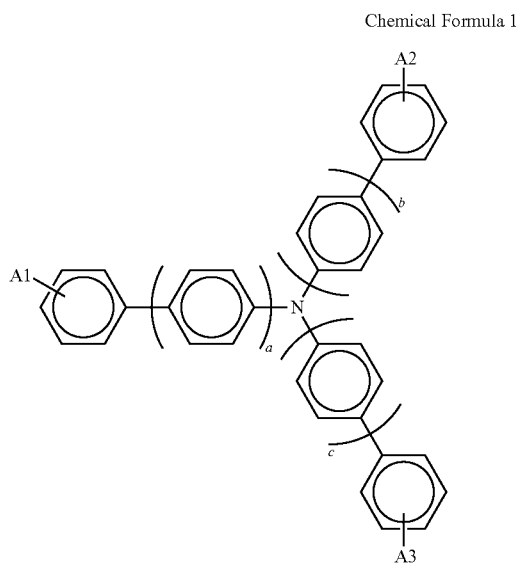

wherein, in Chemical Formula 1, A1, A2, and A3 are each hydrogen, carbazole, dibenzothiophene, dibenzofuran (DBF), or biphenyl, and a, b, and c are each an integer of zero to four.

15. The organic light emitting display as claimed in claim 12, wherein the auxiliary layer includes a compound represented by Chemical Formula 2:

Chemical Formula 2

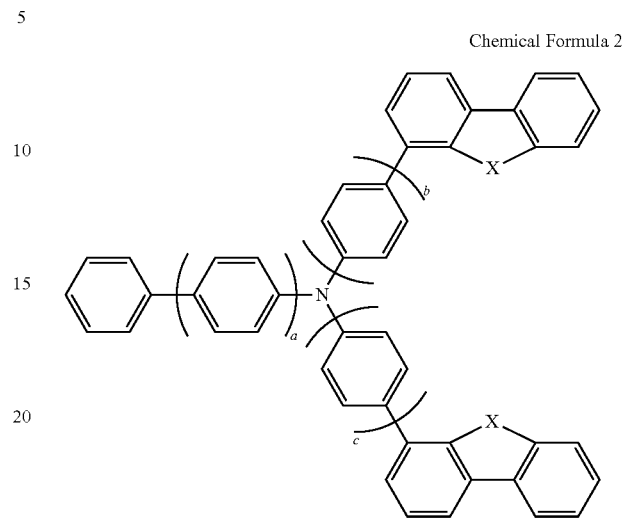

wherein, in Chemical Formula 2, a is 0 to 3, b and c are each 0 to 3, X is selected from O, N, or S, and each X is the same as or different from each other.

* * * * *